United States Patent
Sabapathy

(10) Patent No.: US 10,916,467 B2
(45) Date of Patent: Feb. 9, 2021

(54) APPARATUS HAVING ON-CHIP FAIL SAFE LOGIC FOR I/O SIGNAL IN HIGH INTEGRITY FUNCTIONAL SAFETY APPLICATIONS

(71) Applicant: Texas Instruments Incorporated, Dallas, TX (US)

(72) Inventor: Sam Gnana Sabapathy, Sugarland, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/584,500

(22) Filed: May 2, 2017

(65) Prior Publication Data

US 2018/0203061 A1  Jul. 19, 2018

Related U.S. Application Data

(60) Provisional application No. 62/447,538, filed on Jan. 18, 2017.

(51) Int. Cl.
| | | |
|---|---|---|
| *G01R 31/3187* | (2006.01) | |
| *G01R 31/26* | (2014.01) | |
| *H01L 21/70* | (2006.01) | |
| *G01R 31/317* | (2006.01) | |
| *G06F 30/30* | (2020.01) | |

(52) U.S. Cl.
CPC ........ *H01L 21/70* (2013.01); *G01R 31/31716* (2013.01); *G06F 30/30* (2020.01); *G01R 31/3187* (2013.01)

(58) Field of Classification Search
CPC ............ G01R 31/2851; G01R 31/3177; G01R 31/3187; G06F 11/16; G06F 11/0721; G06F 11/0796; G06F 11/0751

See application file for complete search history.

(56) References Cited

U.S. PATENT DOCUMENTS

| | | | |
|---|---|---|---|
| 5,334,888 A | 8/1994 | Bodas | |
| 5,732,209 A | 3/1998 | Vigil et al. | |
| 6,900,643 B2* | 5/2005 | Deng | G01R 31/025 324/522 |
| 7,263,642 B1 | 8/2007 | Makar et al. | |
| 2002/0070725 A1 | 6/2002 | Hilliges | |
| 2006/0190792 A1 | 8/2006 | Arnold et al. | |
| 2011/0060954 A1* | 3/2011 | Sakada | G06F 11/1004 714/732 |

(Continued)

OTHER PUBLICATIONS

International Search Report and Written Opinion, PCT/2018/014253 dated Aug. 16, 2018 (7 pages).

*Primary Examiner* — Minh N Tang
(74) *Attorney, Agent, or Firm* — Ebby Abraham; Charles A. Brill; Frank D. Cimino

(57) ABSTRACT

A packaged integrated circuit (IC) chip that provides input/output (I/O) signal fail safe verification is disclosed. The packaged IC chip includes a first processing unit, a first control peripheral coupled to receive a first processed signal from the processing unit and to provide an output signal, and compare logic. The compare logic is coupled to receive the output signal and a comparison signal, to compare the output signal and the comparison signal, and to provide an error signal responsive to a difference between the output signal and the comparison signal.

11 Claims, 3 Drawing Sheets

(56) References Cited

U.S. PATENT DOCUMENTS

2012/0166880 A1* 6/2012 Greb ................. G06F 11/002
                                                          714/37
2013/0322176 A1   12/2013 Burggraf, III et al.
2018/0203061 A1    7/2018 Sabapathy
2018/0321305 A1* 11/2018 Stafford ............. G01R 31/2856

\* cited by examiner

APPARATUS HAVING ON-CHIP FAIL SAFE LOGIC FOR I/O SIGNAL IN HIGH INTEGRITY FUNCTIONAL SAFETY APPLICATIONS

CLAIM OF PRIORITY AND RELATED PATENT APPLICATIONS

This nonprovisional application claims priority based upon the following prior United States provisional patent application(s): (i) "On Chip PWM Peripheral Output IO Signal Fail Safe Checker Logic to Achieve Higher Fault Tolerance in Functional Safety Systems and Applications," Application No. 62/447,538, filed Jan. 18, 2017, in the name(s) of Sam Gnana Sabapathy; which is hereby incorporated by reference in its entirety.

FIELD OF THE DISCLOSURE

Disclosed embodiments relate generally to the field of providing functional safety applications. More particularly, and not by way of any limitation, the present disclosure is directed to an apparatus having on-chip input/output (I/O) signal verification for high integrity functional safety applications.

BACKGROUND

Microcontroller Units (MCUs) and other Integrated Circuit (IC) chips used in functional safety applications need to have high coverage for random faults. MCUs typically implement a host of different functions, which can include safety critical functions along with other non-critical functions, e.g. data-logging, human machine interface, etc. An MCU or IC chip needs to provide high levels of safety integrity for the critical control functions, going into a safe state whenever an error in critical functions is detected. Existing solutions utilize external circuits to detect the failure of outgoing signals, although the addition of external safe logic is expensive and increases the time to detection. Functional safety standards, such as ISO26262, IEC61508, IEC61800, IEC81800-5-2 and similar standards describe failure detection time that is increasingly getting smaller in high safety integrity level systems.

SUMMARY

Disclosed embodiments are directed to a packaged IC chip, e.g., an MCU, which is capable of providing on-chip monitoring of the functionality of the supplied signal. Depending on the application, the monitoring and verification can include only critical control peripheral circuitry, such as a Pulse Width Modulator (PWM) and the associated output signal, or can include some or all of the other elements of the chip that are critical to the production of the output signal.

In one aspect, an embodiment of a packaged integrated circuit (IC) chip providing input/output (I/O) signal fail safe verification is disclosed. The packaged IC chip includes a first processing unit; a first control peripheral coupled to receive a first processed signal from the processing unit and to provide an output signal; and compare logic coupled to receive the output signal and a comparison signal, to compare the output signal and the comparison signal, and to provide an error signal responsive to a difference between the output signal and the comparison signal.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Figure 1:
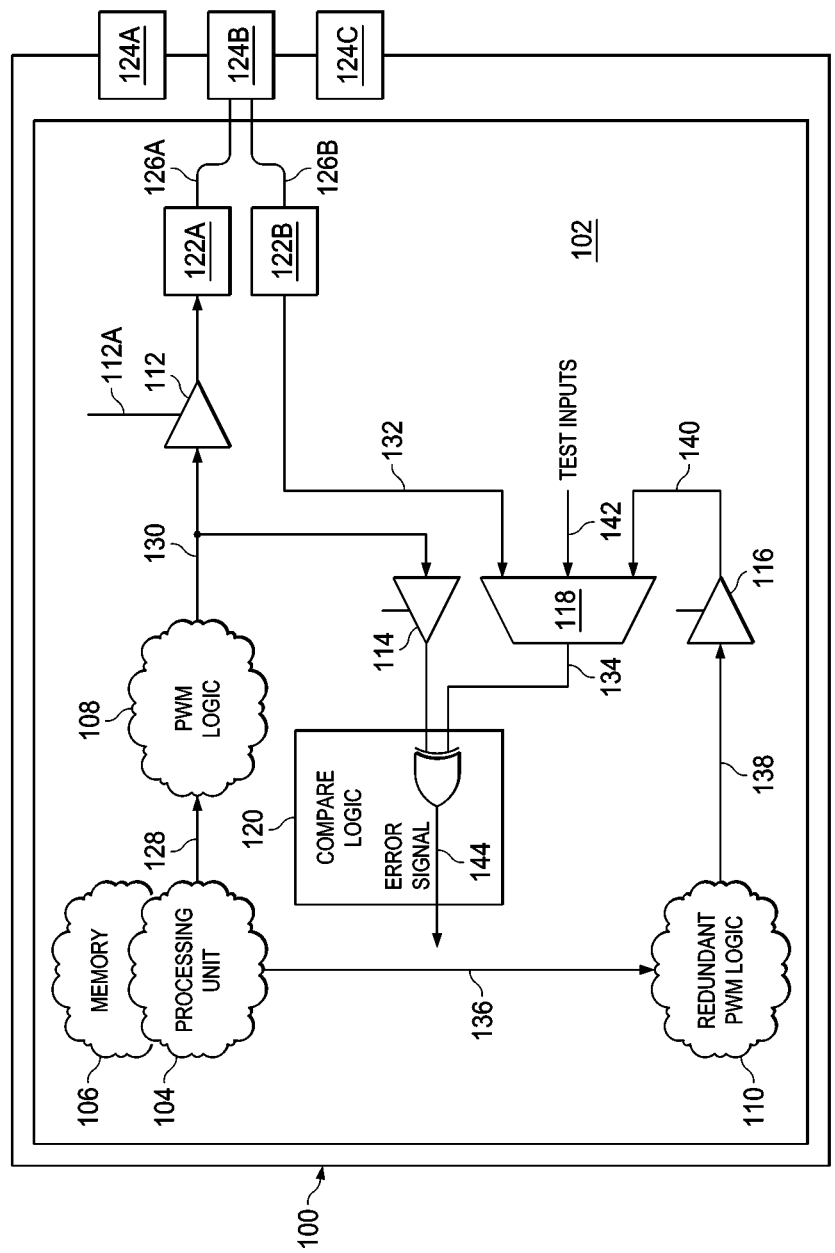
FIG. 1 depicts an example packaged IC chip according to an embodiment of the disclosure.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Control modulation, e.g., PWM, can be highly algorithmic intensive, with the net result of all computations leading to I/O pin signal modulation. Associated with any fail safe system is what is known as latent fault, which can be associated with any portion of the entire processing chain. Performing verification of successively more inclusive portions of the processing chain can provide higher levels of coverage in functional safety applications. The present disclosure is directed to providing a number of methods by which increasing levels of verification can be achieved. The disclosed embodiments are able to provide on-chip verification at various levels of coverage, including true end-to-end coverage from the time an input signal is received on the chip to an output signal provided to the outside world on a device pin. The output signal that is provided to an output bond pad can be compared to at least the following other signals: a redundant control peripheral signal that is produced by, e.g., a second PWM module, a redundant processing chain signal that is produced by a duplicate processing chain and a copy of the output signal that is routed back into the IC chip from a device package pin. The disclosed comparison logic can be provided using either on-chip hardware or on-chip Configurable Logic Blocks (CLB). On-chip failure detection is deterministic and increases the failure metrics. Utilizing the disclosed embodiments, the latent fault in the associated elements such as the Central Processing Unit (CPU), memory, peripheral paths, other peripherals and output paths are well covered for functional safety. Additionally, the response time of functional test of the critical circuitry will be well within the system fault reaction time and will increase diagnostic and latent fault coverage, Turning first to FIG. 1, a schematic diagram of a packaged IC chip 100 that provides I/O signal fail safe checking is shown according to an embodiment of the disclosure. Although the application is discussed in terms of an IC chip that can be an MCU, it will be understood that the disclosed embodiments can be provided on any type of IC chip, e.g., digital signal processor (DSP), microprocessor unit (MPU), digital signal controller (DSC), Application-Specific Integrated Circuit (ASIC), Field-Programmable Gate Array (FPGA) or any analog circuit that can perform mixed signal functions in closed loop or open loop operations. As will be seen herein, a multi-chip module (MCM) can also be utilized to provide the desired fail safe checking. As illustrated, packaged IC chip 100 includes IC chip 102 and device pins 124, which are part of a lead frame (not specifically shown) to which the IC chip 102 has been mounted. Although the disclosed embodiments are discussed in terms of device package pins that are part of a lead frame, it will be understood that the disclosed embodiments can also be utilized with other package types, such as a Ball Grid Array (BGA). Further, while only three device pins 124 and two bond pads 122 are shown in this figure, it will be understood that numerous bond pads 122 and device pins 124 can be present on the packaged IC chip 100. Device pins 124 are attached to bond pads 122 on IC chip 102 via bond wires 126 in order to provide input signals, receive output signals or provide power and ground connections (not specifically shown) to IC chip 102.

IC chip 102 contains a CPU or processing unit 104, which is coupled to a memory 106. Processing unit 104 provides a processed signal 128 to a control peripheral 108, which in the embodiment shown is PWM logic. In an MCU designed to handle critical control signals, processing unit 104 and control peripheral 108 are typically provided in hardware or in firmware. PWM logic 108 is coupled to forward an output signal 130 towards bond pad 122A, which in operation will be coupled to provide output signal 130 as a control signal to both an actuator (not specifically shown) that controls, in one example embodiment, a motor, and also via buffer 114 to compare logic 120. Buffer 112 is coupled to receive output signal 130 and to provide output signal 130 to bond pad 122A as long as a select signal 112A is turned on. As shown in FIG. 1, bond pad 122A is coupled to device pin 124B by bond wire 126A. Device package pin 124B is also coupled to a second bond pad 122B by bond wire 126B. In this manner, bond pad 122B receives output signal 130 as long as there are no breaks in the intervening circuitry. The signal received at bond pad 122B can then be sent towards compare logic 120 as input signal 132. It is desirable to be able to compare the original output signal 130 to several different signals, each of which will be discussed herein. Utilizing different comparison signals can allow the location of an error signal to be determined more easily. To enable output signal 130 to be compared at different times to one of several different signals, input signal 132 is provided to multiplexor 118, which can then selectively provide input signal 132 as a comparison signal 134 to compare logic 120. In one embodiment, compare logic 120 is provided in a CLB; in another embodiment, compare logic is provided in hardware. In one embodiment, compare logic 120 is a simple comparison using, for example, an exclusive OR (XOR) logic block as shown. In one embodiment, compare logic 120 is a smart comparator that is able to make a complex comparison based on appropriate factors. In all embodiments, compare logic 120 is operable to send an error signal 144 whenever the two signals being compared do not agree.

As well as providing the ability to verify that the output signal 130 reached device pin 124B as sent, packaged IC chip 100 provides a means for verifying that PWM logic 108 is operating correctly. In one embodiment, this is accomplished by processing unit 104 sending processed signal 128 to a redundant PWM logic 110 as digital signal 136. Redundant PWM logic 110 utilizes digital signal 136 to perform the same calculations that are performed in PWM logic 108 and sends a redundant peripheral signal 138 towards multiplexor 118. In one embodiment, redundant peripheral signal 138 is received at buffer 116, which selectively provides redundant signal 140 to multiplexor 118. Using redundant PWM logic 110, compare logic 120 is able to verify that PWM logic 108 is operating correctly. Additional diversity/verification capabilities can be provided by having processing unit 104 produce digital signal 136 using a different algorithm from the algorithm used to provide processed signal 128. The use of a separate algorithm provides a check on the calculations utilized by processing unit 104 and adds another level of verification. In one embodiment, multiplexor 118 is also coupled to receive test inputs 142, which can be provided from an on-chip or off-chip source (not specifically shown). Test inputs 142 are designed to test the compare logic 120 and ensure that compare logic 120 is operating properly. Test inputs 142 can be provided periodically.

Figure 2:
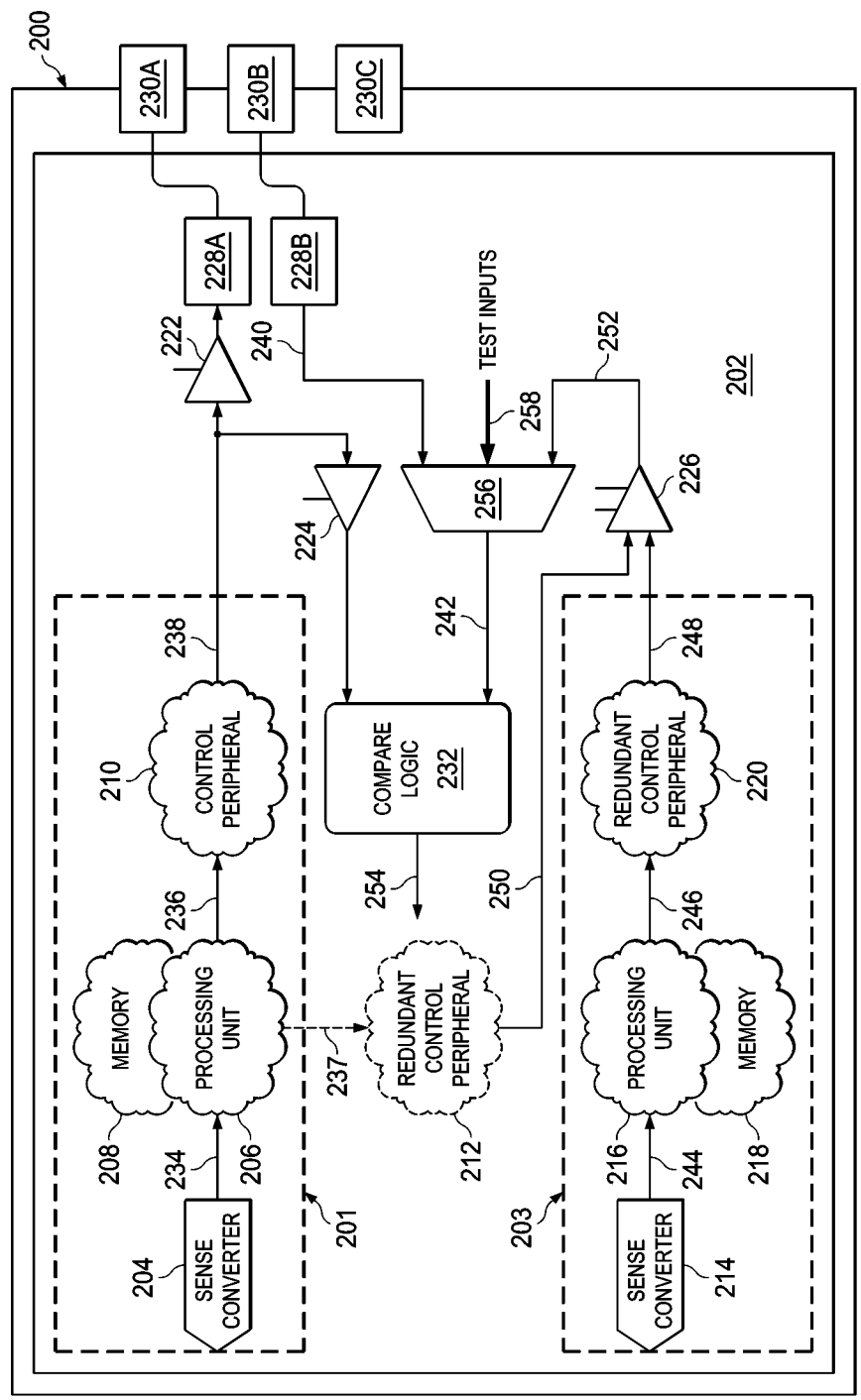
FIG. 2 depicts an example packaged IC chip according to an embodiment of the disclosure.

FIG. 2 depicts a schematic diagram of a packaged IC chip 200 that provides I/O signal fail safe checking according to another embodiment of the disclosure. In packaged IC chip 200, IC chip 202 contains full duplication of the entire processing chain that provides the safety critical signal. In a first processing chain 201, a sense converter 204 receives a first input signal 260 from a sensor (not specifically shown) and provides a digital signal 234 to a first processing unit 206 and associated memory 208. Sense converter 204 can be an analog-to-digital converter (ADC), a Delta-Sigma (AZ) modulator, a capture unit or similar device. The first processing unit 206 performs necessary calculations on the provided digital signal and sends a processed signal 236 to a first control peripheral 210, which performs necessary control functions and sends an output signal 238 towards bond pad 228A. Between the first control peripheral 210 and bond pad 228A, buffer 222 provides a selection switch that determines whether the output signal is provided to bond pad 228A. The first processing unit 206 can optionally also send a processed signal 237 to a redundant control peripheral 212; processed signal 237 can be either the same signal that was sent to first control peripheral 210 or a separately determined signal, as discussed in the embodiment of FIG. 1. In one embodiment, sense converter 204 receives an analog signal from an electric motor, and control peripheral 210 is a PWM that provides output signal 238. Output signal 238 can be provided to any power stage that is capable of converting or translating a low voltage output signal to a qualified or modulated high voltage signal, e.g., in an uninterruptable power system (UPS), digital power conversion system (DC-DC or DC-AC) or electrical to motion conversion systems (e.g., an electric motor). Control peripheral 210 can also provide any type of digital actuator logic.

In a second processing chain 203, a sense converter 214 receives a second input signal 262 from a sensor (not specifically shown) and provides a digital signal 244 to a second processing unit 216 and associated memory 218. In one embodiment, sense converter 204 and sense converter 214 receive copies of the same signal from a single sensor. In one embodiment, sense converter 204 receives a first signal from a first sensor and sense converter 214 receives a second signal from a second sensor that is different from the first sensor. Processing unit 216 performs necessary calculations on the provided digital signal 244 and sends a processed signal 246 to redundant control peripheral 220, which sends a redundant processing chain signal 248 towards compare logic 232. In one embodiment, buffer 226 sits between the redundant control peripheral 220 and compare logic 232 and provides a selection switch that determines whether the redundant processing chain signal 248 is provided to multiplexor 256. In an embodiment in which control peripheral 212 is provided, buffer 226 has dual selection switches in order to select which of the two signals is forwarded towards multiplexor 256. In one embodiment (not specifically shown), both redundant peripheral signal 250 and redundant signal-chain signal 248 can be separately provided directly to multiplexor 256.

As shown in FIG. 2, multiplexor 256 receives three signals that can be selectively forwarded towards compare logic 232: redundant signal 252, which can be either redundant peripheral signal 250 or redundant processing chain signal 248, test inputs 258, which are provided to test compare logic 232, and input signal 240, which receives an input signal received on device pin 230B and bond pad 228B. Compare logic 232 compares a comparison signal 242 that is provided by multiplexor 256 with output signal 238 that can be selectively forwarded through buffer 224 and can provide error signal 254 when the two signals do not agree. Output signal 238 is also provided to buffer 222, bond pad 228A and device pin 230A. This embodiment is designed to have device pins 230A and 230B tied together on a printed circuit board (PCB) (not specifically shown), so that an off-chip feedback connection is provided. Device pin 230B is coupled to bond pad 228B via a bond wire and the resultant input signal 240 is provided to multiplexor 256. Alternatively, bond pad 228B can be coupled to device pin 230A, similar to the coupling seen in FIG. 1, in order to provide an on-chip feedback connection to provide input signal 240.

Using the disclosed packaged IC chip 200, multiple different operations of IC chip 202 can be monitored and verified. Comparing output signal 238 to redundant peripheral signal 250 can determine that control peripheral 210 is operating correctly; comparing output signal 238 to redundant processing chain signal 248 can ensure that the entire processing chain is operating correctly; and comparing output signal 238 to input signal 240 can ensure that the signal that was determined at control peripheral 210 actually made its way to device pin 230A. Compare logic 232 is also tested by comparing output signal 238 to test inputs 258. In one embodiment, packaged IC chip 200 is a C2000™ MCU chip sold by Texas Instruments Incorporated. In one embodiment, the two processing units 206, 216 in packaged IC chip 200 are identical processors, such as a C28x™ DSP. In one embodiment, the two processing units 206, 216 in packaged IC chip 200 are different types of processors that introduce additional diversity into the processing chains, e.g., the first processing chain includes a C28x™ DSP processor while the second processing chain includes a Control Law Accelerator (CLA) processor, all in the same chip. When the processing chains include different processors, compare logic 232 can contain complex comparison logic that accounts for differences between the processors. Further details regarding embodiments having two processing chains can be found in co-pending application Ser. No. 15/584,550, having inventors Jeffrey Stafford, Prasanth Viswanathan Pillai and Ashish Vanjari, filed on the same date as the present application, which is hereby incorporated by reference.

Figure 3:
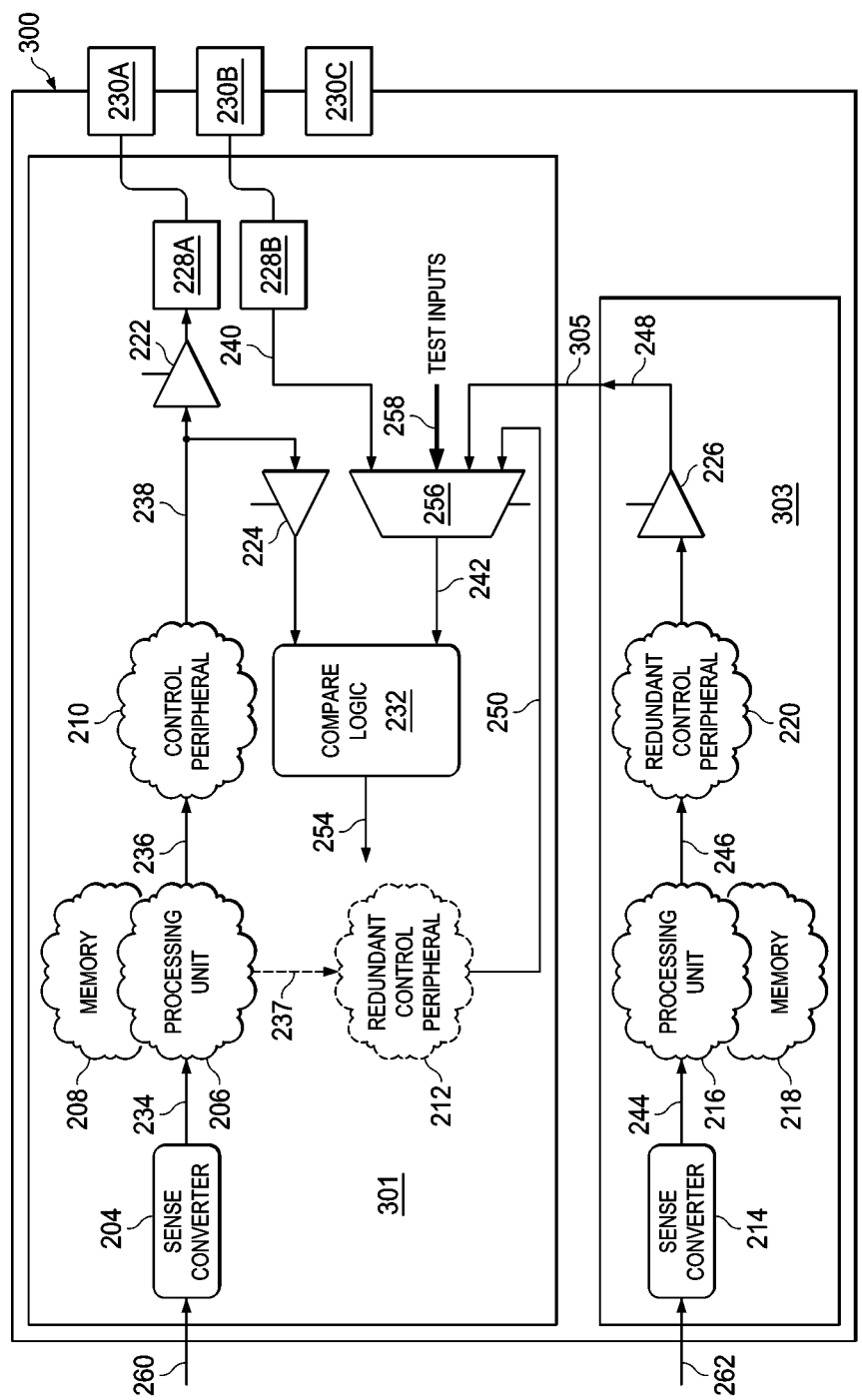
FIG. 3 depicts an example multi-chip module according to an embodiment of the disclosure.

FIG. 3 depicts a multi-chip module 300 according to an embodiment of the disclosure. In MCM 300, the components used to provide verification of the primary processing chain are the same, but the redundant processing chain is provided as a separate chip. IC chip 301 includes compare logic 232 and the primary processing chain, which includes sense converter 204, processing unit 206 and control peripheral 210. Redundant control peripheral 212 can also be provided is desired. IC chip 303 provides the redundant processing chain, which includes sense converter 214, processing unit 216 and redundant control peripheral 220. IC chip 301 and IC chip 303 will each have separate power supplies and separate clocks, but are bonded inside MCM 300. Although only IC chips 301, 303 are shown in this figure for simplicity, it will be understood that MCM can include any number of additional chips coupled together. In MCM 300, redundant processing chain signal 248 is provided to a bond pad (not specifically shown) on IC chip 303. Bond wire 305 ties the bond pad on IC chip 303 to a bond pad (also not specifically shown) on IC chip 301, from which redundant processing chain signal 248 is provided to multiplexor 256. The embodiment of MCM 300 can provide diverse processor capabilities and diversity to sensing, processing and actuation paths. In this implementation as an MCM, if the silicon dies 301 and 303 are powered and clocked independently the limitation of common cause problem are reduced and the fault coverage of the sensing, processing and PWM actuation chain will higher than the implementation in FIG. 1 and FIG. 2.

Utilizing the disclosed embodiments, the safety integrity of an output signal can be provided at varying levels of coverage in dependence on the needs of a system. The disclosed packaged IC chip enables a reliable way to test control peripherals during device manufacturing and improve systematic and random failure mode coverage during real-time operation of the device. The disclosed packaged IC chip can also reduce device test cost and capture early defects caused by systematic and random defects. Fault coverage metrics during runtime can be greater than ninety-nine percent. Because the monitoring and verification is performed on the sensing, processing and critical control signals, such as PWM pairs, the disclosed packaged IC chip can provide an inexpensive solution to achieve very high fault coverage.

Utilizing the disclosed feedback path from the device pins also provides an easy method to check faults occurring at the I/O stage. Faults in the I/O stage can include an electrostatic discharge event that can blow out a buffer. A device pin can also have multiple drivers coupled to the pin; if two drivers drive a signal to the device pin at the same time, the resulting signal can cause latch-up and also blow the buffer. Latent defects in the circuitry, e.g., a weakness in a metal conductive line, can cause marginality in the I/O buffer that provides intermittent errors. Even interactions on the PCB to which the packaged chip is mounted can cause disruptions in the control signal, e.g., by damaging the silicon of the IC chip. The disclosed feedback path and on-chip comparison logic provides detection of such events, even when the issue is partial or temporary.

The disclosed packaged IC chip can offer higher safety integrity and reliability checks during system operation, reduce device test cost, capture early defects due to systematic and random defects and enable safety metric calculation in functional safety standards, such as ISO26262, IEC61508, IEC61800-5-2 and similar standards.

Although various embodiments have been shown and described in detail, the claims are not limited to any particular embodiment or example. Elements shown in one embodiment can be combined with elements shown in an alternate embodiment. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit (IC), the IC comprising:
   a first processing unit having a first process signal output;
   a first control unit having a first control unit input and a first control unit output, the first control unit input is coupled to the first process signal output;
   a redundant control unit having a redundant control unit input and a redundant control unit output, the redundant control unit input is coupled to the first process signal output;
   a multiplexer having a multiplexer input and a multiplexer output, the multiplexer input is coupled to the redundant control unit output; and
   a comparator having a first input coupled to the first control unit output, a comparison signal input, and an error signal output, the comparison signal input is coupled to the multiplexer output.

2. The IC in claim 1 further comprising:
   a first processing chain that comprises a first sense converter, the first processing unit and the first control unit, the first sense converter being coupled to receive a first input signal and to provide a first digital signal to the first processing unit; and
   a second processing chain comprising a second sense converter, a second processing unit and a second control unit, the second sense converter being coupled to receive a second input signal and to provide a second digital signal to the second processing unit, the second control unit being coupled to receive a second processed signal from the second processing unit and to provide a redundant processing chain signal to the multiplexer for selective use as a comparison signal.

3. The IC in claim 2 further comprising:
   a first bond pad coupled to receive an output signal and to provide the output signal to a first device pin; and
   a second bond pad coupled to receive an input signal from a second device pin and to provide the input signal to the multiplexer for selective use as the comparison signal.

4. The IC in claim 3 wherein the multiplexer is further coupled to receive an external test signal for selective use as the comparison signal.

5. The IC in claim 2 further comprising:
   a first bond pad coupled to receive an output signal and to provide the output signal to a first device pin; and
   a second bond pad coupled to receive an input signal from a first device package pin and to provide the input signal to the multiplexer for selective use as the comparison signal.

6. The IC in claim 1 wherein the first control unit receives a first processed signal, the redundant control unit receives a third processed signal, the first processed signal is provided by a first algorithm running on the first processing unit, and the third processed signal is provided by a second algorithm running on the first processing unit.

7. The IC in claim 1 wherein the first control unit is a pulse width modulator.

8. The IC in claim 1 wherein the comparator is a smart comparator.

9. The IC in claim 1 wherein the comparator comprises an exclusive OR logic gate.

10. The IC in claim 1 further comprising a redundant processing chain that is coupled to the comparison signal input.

11. The IC in claim 1 further comprising a device package pin that is coupled to the comparison signal input.

* * * * *